(12) United States Patent
Ando et al.

(10) Patent No.: US 9,972,497 B2
(45) Date of Patent: May 15, 2018

(54) DEVICES WITH MULTIPLE THRESHOLD VOLTAGES FORMED ON A SINGLE WAFER USING STRAIN IN THE HIGH-K LAYER

(71) Applicant: INTERNATIONAL BUSINESS MACHINES CORPORATION, Armonk, NY (US)

(72) Inventors: Takashi Ando, Tuckahoe, NY (US); Mohit Bajaj, Bangalore (IN); Terence B. Hook, Jericho, VT (US); Rajan K. Pandey, Bangalore (IN); Rajesh Sathiyanarayanan, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 15/157,772

(22) Filed: May 18, 2016

(65) Prior Publication Data

US 2017/0103982 A1    Apr. 13, 2017

Related U.S. Application Data

(62) Division of application No. 14/880,918, filed on Oct. 12, 2015, now Pat. No. 9,627,484.

(51) Int. Cl.
*H01L 27/088* (2006.01)
*H01L 21/28* (2006.01)
(Continued)

(52) U.S. Cl.
CPC .... *H01L 21/28185* (2013.01); *H01L 21/0217* (2013.01); *H01L 21/225* (2013.01); *H01L 21/28176* (2013.01); *H01L 21/3115* (2013.01); *H01L 21/31155* (2013.01); *H01L 21/324* (2013.01); *H01L 21/823462* (2013.01); *H01L 27/088* (2013.01); *H01L 29/1054* (2013.01);
(Continued)

(58) Field of Classification Search
CPC ............. H01L 21/28176; H01L 21/324; H01L 29/495; H01L 29/4966; H01L 29/1054; H01L 21/3115; H01L 27/088; H01L 29/7849; H01L 29/66477; H01L 29/511; H01L 21/823462; H01L 21/28185; H01L 29/517
USPC ............... 257/288, 367, 369, 391, 392, 407; 438/151, 174, 197, 194, 199, 217
See application file for complete search history.

(56) References Cited

U.S. PATENT DOCUMENTS 7,462,527 B2    12/2008  Conti et al.
7,585,720 B2    9/2009   Sudo
(Continued)

OTHER PUBLICATIONS

List of IBM Patents or Patent Applications Treated as Related dated Sep. 19, 2016, 2 pages.
(Continued)

*Primary Examiner* — Shahed Ahmed
(74) *Attorney, Agent, or Firm* — Tutunjian & Bitetto, P.C.; Vazken Alexanian

(57) ABSTRACT

A method for adjusting a threshold voltage includes depositing a strained liner on a gate structure to strain a gate dielectric. A threshold voltage of a transistor is adjusted by controlling an amount of strain in the liner to control an amount of work function (WF) modulating species that diffuse into the gate dielectric in a channel region. The liner is removed.

18 Claims, 4 Drawing Sheets

(51) Int. Cl.
*H01L 21/02* (2006.01)
*H01L 21/3115* (2006.01)
*H01L 21/8234* (2006.01)
*H01L 21/225* (2006.01)
*H01L 29/10* (2006.01)
*H01L 29/51* (2006.01)
*H01L 29/66* (2006.01)
*H01L 29/78* (2006.01)
*H01L 21/324* (2006.01)
*H01L 29/49* (2006.01)

(52) U.S. Cl.
CPC ........ *H01L 29/495* (2013.01); *H01L 29/4966* (2013.01); *H01L 29/511* (2013.01); *H01L 29/517* (2013.01); *H01L 29/66477* (2013.01); *H01L 29/7849* (2013.01)

(56) References Cited

U.S. PATENT DOCUMENTS

| | | | |
|---|---|---|---|
| 7,923,319 B2 | 4/2011 | Futase et al. | |
| 8,441,073 B2 | 5/2013 | Nakajima et al. | |
| 8,467,233 B2 | 6/2013 | Yu et al. | |
| 8,470,678 B2 | 6/2013 | Cai et al. | |
| 2007/0001238 A1* | 1/2007 | Koyama | H01L 21/823842 257/407 |
| 2008/0272437 A1* | 11/2008 | Doris | H01L 21/28176 257/369 |
| 2009/0039436 A1* | 2/2009 | Doris | H01L 21/823807 257/369 |
| 2011/0042728 A1 | 2/2011 | Cheng et al. | |
| 2013/0273729 A1* | 10/2013 | Hempel | H01L 21/823807 438/592 |
| 2014/0094004 A1* | 4/2014 | Kamath | H01L 27/1292 438/157 |
| 2014/0151817 A1* | 6/2014 | Bohr | H01L 21/76831 257/410 |
| 2014/0183653 A1 | 7/2014 | Niimi et al. | |
| 2017/0040435 A1* | 2/2017 | Lu | H01L 29/66545 |

OTHER PUBLICATIONS

Belyansky, M. et al., "Methods of producing plasma enhanced chemical vapor deposition silicon nitride thin films with high compressive and tensile stress," Journal of Vacuum Science and Technology, vol. 26, No. 3, Apr. 2008. (pp. 517-521).

Cai, M. et al., "Stress Liner Effects for 32-nm SOI MOSFETs With HKMG," IEEE Transactions on Electron Devices, vol. 57, No. 7, Jul. 2010. (1076-1079).

Cartier, E. et al., "PFET VT Control With HFO2/Tin/Poly-Si Gate Stack Using a Lateral Oxygenation Process," Symposium on VLSI Technology Digest of Technical Papers, Jun. 2009. (pp. 42-43).

* cited by examiner

DEVICES WITH MULTIPLE THRESHOLD VOLTAGES FORMED ON A SINGLE WAFER USING STRAIN IN THE HIGH-K LAYER

BACKGROUND

Technical Field

The present invention relates to semiconductor processing and devices, and more particularly to devices and methods employing multiple threshold voltages on a same wafer or chip.

Description of the Related Art

Multiple threshold voltage (multi-Vt) technology is needed for obtaining performance benefits arising out of transistor scaling without paying a severe penalty in terms of leakage power consumption. Multi-Vt devices can be fabricated through changes to different parts of a wafer. These parts may include changes to a gate oxide material (including thickness); changes to a work function (WF) metal in a gate conductor; and dopant concentration changes to name a few. All of these changes involve significant process complexity. The process complexity associated with these changes is further increased with the use of fin field effect transistor (finFET) technology. The proposed processes provide a simpler method to fabricate multi-Vt devices, thus providing significant benefit in terms of reduced process complexity.

SUMMARY

A method for adjusting a threshold voltage includes depositing a strained liner on a gate structure to strain a gate dielectric. A threshold voltage of a transistor is adjusted by controlling an amount of strain in the liner to control an amount of work function (WF) modulating species that diffuse into the gate dielectric in a channel region. The liner is removed.

Another method for adjusting threshold voltage includes depositing two or more liners on two or more different regions of a device, such that the liners impart two or more different strain levels on respective gate dielectric layers; introducing work function (WF) modulating species to the gate dielectric layers wherein due to the different strain levels in the gate dielectric layers, different amounts of the WF modulating species diffuse to the gate dielectric layers at a channel region, resulting in different threshold voltage values; and removing the two or more liners.

A semiconductor device having multiple threshold voltages across the device includes transistors divided into at least two zones on a same device. The transistors in a first zone include a gate dielectric having a first density of work function (WF) modulating species diffused into the gate dielectric in a channel region to provide a first threshold voltage. The transistors in a second zone include a gate dielectric having a second density of WF modulating species diffused into the gate dielectric in a channel region to provide a second threshold voltage.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
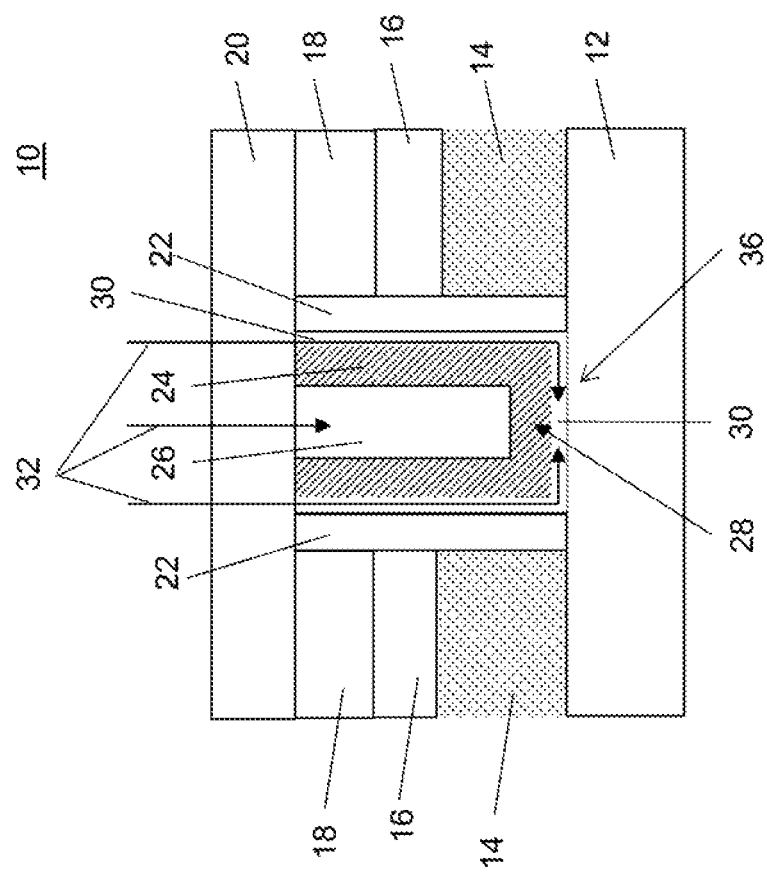
FIG. 1 is a cross-sectional view of a field effect transistor device having a strained liner formed thereon and in communication with a gate dielectric in accordance with the present principles.

In accordance with the present principles, methods for fabricating multi-Vt devices on a single wafer or chip are provided. The method may be employed to fabricate multi-Vt devices on different regions of a chip. In one embodiment, two or more different types of middle of the line (MOL) nitride liners are deposited on two or more different regions of the chip. These liners impart two or more different strain levels to a high-k gate dielectric layer. An implantation and/or anneal may be employed to introduce work function (WF) modulating species (e.g., O, OH, etc.) into the high-k layer. Then, the liners are etched away and replaced by depositing a replacement MOL liner.

An amount of strain in the high-k gate dielectric layer modulates diffusion lengths of atoms in that layer. This leads to different amounts of WF-modulating atoms (e.g., O, OH, etc.) reaching the region between a channel and a high-k (HK)/metal gate (MG) in the different regions of the chip. In addition, different types of the MOL nitride liner may be employed to inject different amounts of WF-modulating atoms into the high-k layer. As a result, devices with different threshold voltages on a same chip are provided.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiN. These compounds include different proportions of the elements within the compound, e.g., $SiN_x$ where x is less than or equal to 1, etc. In addition, other elements may be included in the compound, such as, e.g., SiBCN, and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, an illustrative structure is shown for a planar field effect transistor (FET) device 10 for demonstrating principles in accordance with present embodiments. It should be understood that the present principles will be described in terms of the planar device 10, but are also applicable to other structures as well, e.g., finFET devices, vertical devices, etc. The device 10 includes a semiconductor 12, which may include monocrystalline Si, SiGe, or other material. The semiconductor 12 functions as a channel region between two epitaxially grown source and drain (S/D) regions 14. The semiconductor 12 may be formed on a semiconductor-on-insulator (SOI) substrate or a bulk substrate.

A gate structure 28 is formed over the semiconductor 12. The gate structure 28 includes a gate dielectric 30, which may include a high-k dielectric, such as $HfO_2$, although other materials may be employed. Gate structure 28 includes a gate conductor, which may be comprised of one or more conductive materials. The gate conductor may include a work function (WF) metal 24 and a main conductor 26. Suitable n-type WF metals include, but are not limited to, titanium nitride (TiN), tantalum nitride (TaN), and aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and tantalum aluminum carbide (TaAlC). Suitable p-type WF metals include, but are not limited to, TiN, TaN, and tungsten (W). TiN and TaN are relatively thick (e.g., greater than about 2 nm) when used as p-type WF metals. However, very thin TiN or TaN layers (e.g., less than about 2 nm) may also be used beneath Al-containing alloys in n-type WF stacks to improve electrical properties such as gate leakage currents. Thus, there is some overlap in the exemplary n- and p-type WF metals given above. The main conductor 26 may include a metal such as, e.g., W. The gate structure 28 may include sidewall spacers 22. The spacers 22 include a dielectric material, such as, e.g., SiN.

One or more dielectric layers 16 and 18 may be formed. For example, layer 16 may include a flowable oxide layer while layer 18 may include a high density plasma (HDP) oxide. The dielectric layers 16, 18 provide a surface level with an open gate structure 28 to permit modification of the gate conductor (24) and gate dielectric 30 in accordance with the present principles.

A modifying liner 20 is deposited over the gate structure 28 (and on layer 18) to provide WF modulating species 32 (e.g., O, OH, etc.) to the gate dielectric 30. The gate dielectric 30 is exposed directly to the liner 20 at a top surface. The modifying liner 20 can be deposited in selected areas of a chip or a wafer. Different types of modifying liners 20 may be employed to provide different amounts of modulating species 32 to the gate dielectric 30. In one embodiment, all devices on a chip or on a wafer are exposed to a single type of modifying liner 20 to adjust threshold devices of all devices on that wafer or chips. In other embodiments, multiple different liner compositions may be employed or portions of chips, portions or wafers, or combinations thereof. In this way, multiple threshold voltages may be programmed across a chip or wafer.

Multiple threshold voltages on different regions of a wafer or chip may be obtained by depositing two or more different types of liners 20 on two or more different regions of the chip or wafer, such that the liners 20 impart two or more different strain levels on the high-k gate dielectric layer 30. The strain levels of the liner 20 may be compressive, tensile or neutral. The amount of stress imparted alters a diffusion length of the species 32 through the dielectric layer 30. The liner(s) 20 may include a nitride, such as SiN, and in particular $Si_3N_4$. The liners 20 may be doped or otherwise include WF modulating species 32 (e.g., O, OH, etc.) or an implantation or anneal is performed to introduce the WF modulating species 32 in the high-k gate dielectric layer 30.

The modifying liner 20 is deposited with a deposition temperature and a thickness configured to impart a strain to underlying structures. The liner 20 may be deposited using a plasma enhanced chemical vapor deposition (PECVD) process, although other deposition processes may be employed. In useful embodiments, deposition temperatures may range from about 300 degrees C. to about 550 degrees C., although other temperatures may be employed. The liner 20 may include a thickness of between about 1 nm to about 10 nm or greater depending on the strain levels desired.

After deposition or during deposition, annealing is performed to drive-in the WF modulating species 32 into the gate dielectric 30 in the channel region 36. The anneal process may include a temperature of between about 300 and about 400 degrees C. for a duration of between a few seconds to up to a minute. The anneal process may include a cyclical process, where one or more temperature cycles are employed.

The liner 20 affects the amount of strain in the high-k gate dielectric layer 30 and therefore modulates diffusion lengths of the atoms in that layer 30. This leads to different amounts of WF modulating atoms or species 32 (e.g., O and OH) reaching the region between a channel 36 and WF gate conductor 24 in different regions of the chip or wafer. The modulating species 20 can diffuse along the gate dielectric 30 to reach the channel region 36. Different types of the liner 20 may be employed to inject different amounts of WF modulating atoms 32 into the high-k gate dielectric layer 30 to form devices with different threshold voltages in the same wafer or chip.

After the modulating atoms or species 32 are introduced through implantation or anneal, the liner(s) 20 are removed followed by a deposition of replacement materials or liners. The modulating species 32 may include ions (e.g., O, OH, etc.). In one embodiment, the work function of the gate conductor is modulated based upon an accumulated charge in the gate dielectric 30. In one embodiment, the charge density for a $HfO_2$ gate dielectric may be between $0.5 \times 10^{18}/cm^3$ to about $2 \times 10^{18}/cm^3$. Other charge densities may also be employed.

Figure 2:
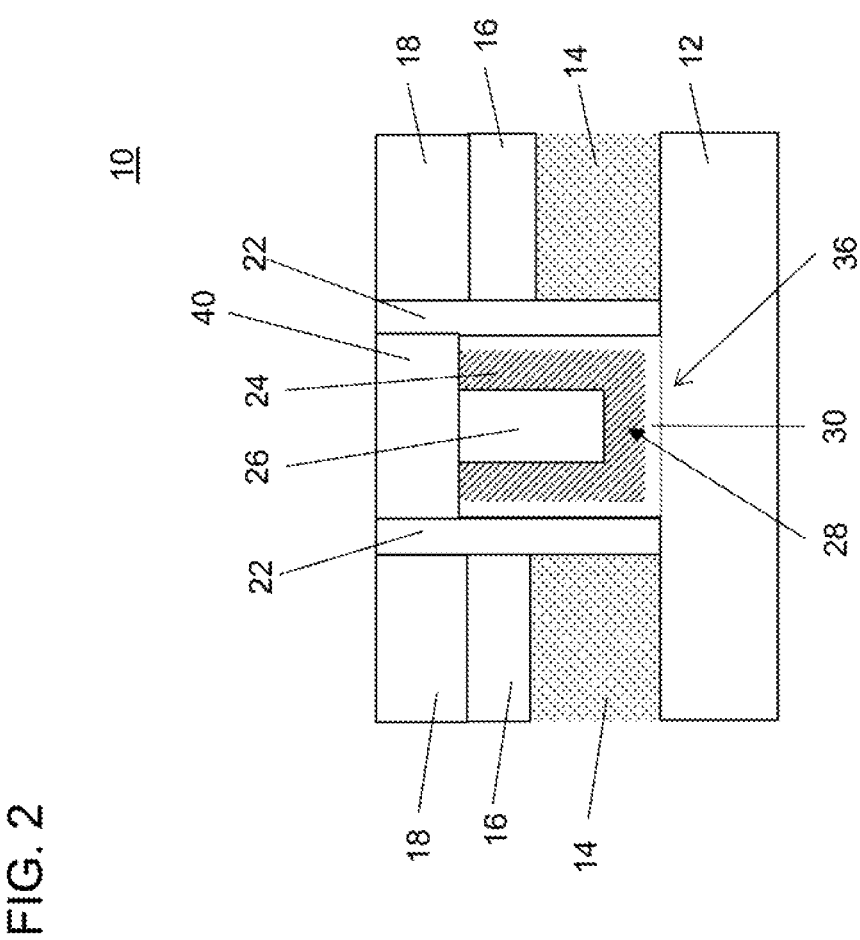
FIG. 2 is a cross-sectional view of the field effect transistor device of FIG. 1 showing the strained liner removed and replaced by a cap layer in accordance with the present principles.

Referring to FIG. 2, the illustrative structure for planar FET device 10 is shown after the removal of the liner (20) and after forming a gate cap 40. The gate cap 40 may be deposited, followed by a planarization process. The gate cap 40 may include a silicon nitride material. Processing can continue to complete the device or devices on the wafer or chip.

Figure 3:
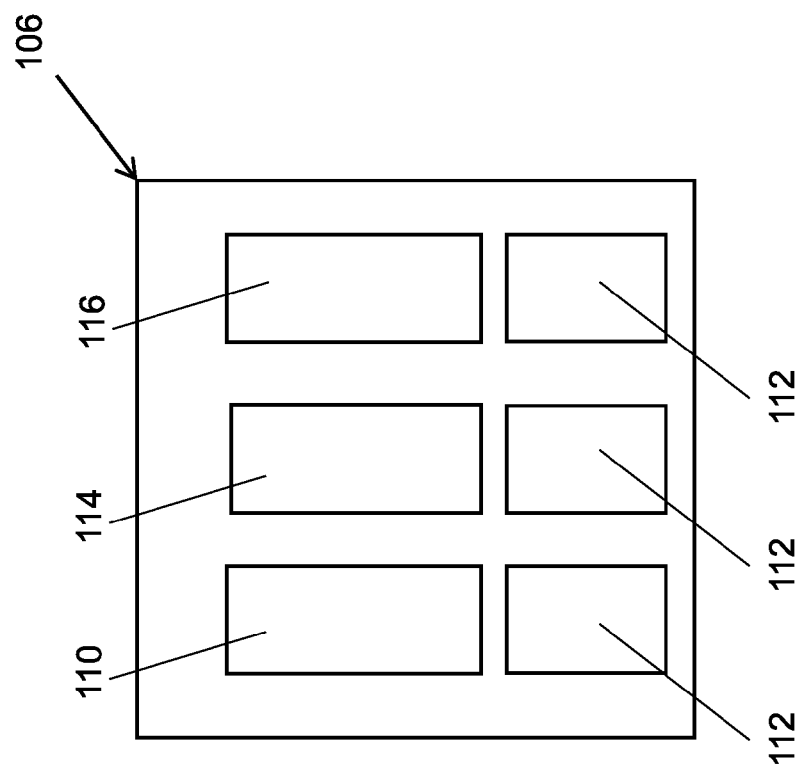
FIG. 3 is a plan view of a semiconductor chip showing regions where transistor devices are processed to have different threshold voltages in accordance with the present principles.

Referring to FIG. 3, different threshold voltages may be employed across a single chip 106. The chip 106 includes regions 110, 112, 114 and 116. Each region 110, 112, 114 and 116 may be processed with a different liner to affect the threshold voltage programmed in that respective region. It should be understood that the different liners may include liners with different chemistries (e.g., carrying different modulating species), different strains (thicker or thinner liners can affect diffusion length in the gate dielectric layers), etc.

The threshold voltage of the devices fabricated in accordance with the present principles is achieved through a choice of liner and the strain on the high-k dielectric layer. For example, Table 1 shows different types of nitride liners to provide different threshold voltage changes (ΔVt in volts). Table 1 is provided for illustrative purposes. Other processes and liner types are contemplated.

TABLE 1

| LINER TYPE AND FORMATION PROCESS: | nFET ΔVt | pFET ΔVt |
|---|---|---|
| Compressive liner formed at 400 C., thickness = 380 Angstroms | 0.111 | 0.043 |
| PECVD compressive liner formed at 400 C., thickness = 250 Angstroms | 0.049 | 0.056 |
| Neutral liner formed at 400 C., thickness = 380 Angstroms | 0.073 | 0.030 |

In accordance with useful embodiments, $HfO_2$ was employed as a gate dielectric. Experiments by the present inventors have shown that it is easier to strain $HfO_2$ than SiN in a $SiN/HfO_2$ system, and that SiN can exert considerable strain on $HfO_2$ to affect diffusion length. The present inventors have also determined that oxygen vacancies (e.g., $V_o^{2+}$) diffusing through the $HfO_2$ provide a most probable mechanism for controlling threshold voltage changes. Table 2 shows diffusion length in $HfO_2$ for different diffusing species. Doubly positive oxygen vacancy ($V_o^{2+}$) mediated diffusion is believed to be the most probable species contributing to changes in Vt.

TABLE 2

| Diffusing species | Diffusion length (nm) |
|---|---|
| O (interstitial mechanism) | <1 |
| O (exchange mechanism) | 500 |
| O (Vo-mediated) | <1 |
| O ($Vo^{2+}$-mediated) | 280 |
| H (interstitial mechanism) | $2.6 \times 10^3$ |

Oxygen vacancies diffuse into and re-distribute uniformly after passivation in $HfO_2$. When the liner (20, FIG. 1) provides compressive strain (e.g., −0.5%), $V_o^{2+}$ in the channel area is passivated to provide Vt modulation. When the liner (20, FIG. 1) provides tensile strain (e.g., +0.5%), less $V_o^{2+}$ passivation is provided due to reduced diffusion length and less impact on Vt is observed. With no strain from the liner (20, FIG. 1), the amount of $V_o^{2+}$ passivation and resultant Vt modulation is in the middle of previous two cases. Diffusion length changes by one order of magnitude between +0.5% and −0.5% strain and by ~2 orders of magnitude between 1% and −1% strain. Therefore, $V_o^{2+}$ diffusion in $HfO_2$ is an effective control for Vt and, in particular for NFET Vt, which can be modulated by the liner since a strong dependence of Vt change exists. Other controls include stress/strain level of SiN in the liner, OH concentration (or other species), etc. to tune the Vt in the range between, e.g., 0-111 mV. Table 3 shows an illustrative relationship between SiN liners and Vt change.

TABLE 3

| SiN Liner | NFET Vt change |
|---|---|
| Compressive strain in SiN with high [OH] | 111 mV |
| Neutral strain in SiN with high [OH] | 73 mV |
| Neutral strain in SiN with low [OH] | 49 mV |

The bonds between Si and N in SiN tend to be more covalent than the bonds between Hf and O in $HfO_2$. This leads to higher elastic modulus and lower dielectric contacts in SiN. It is easier to strain HfO$_2$ than SiN. In a SiN/HfO$_2$ system, the SiN can exert considerable strain while the reverse (e.g., HfO$_2$ straining SiN) is less likely.

Figure 4:
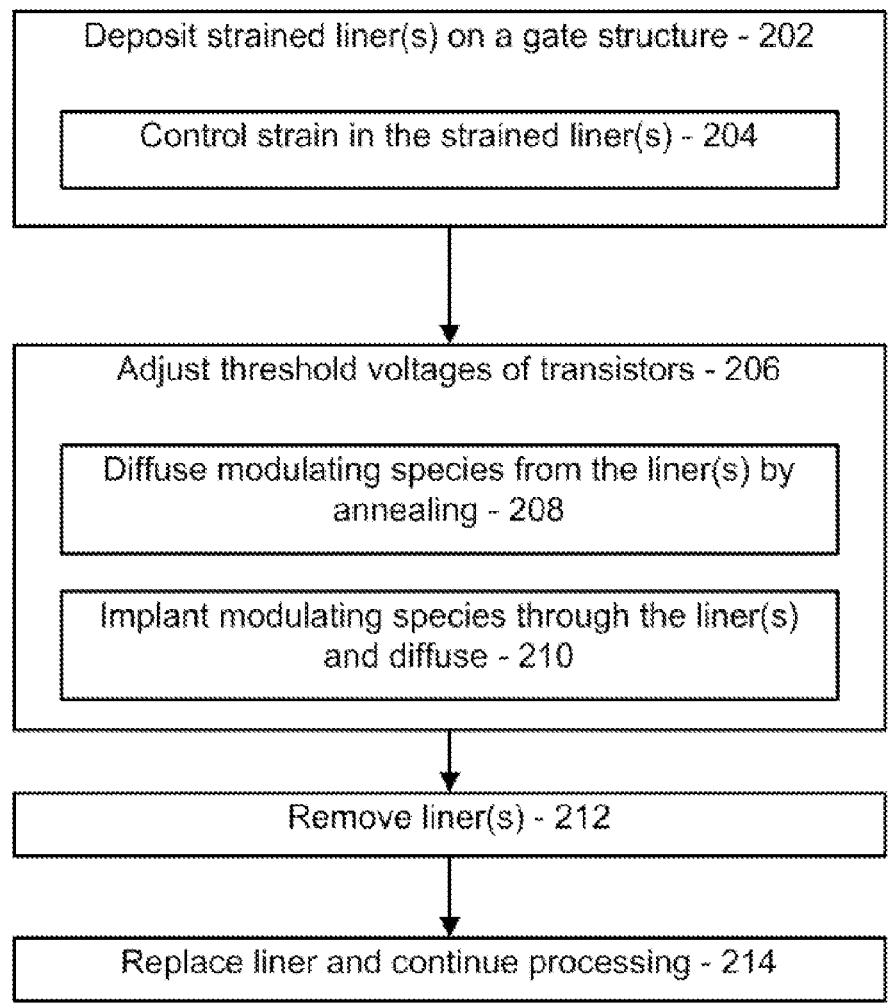
FIG. 4 is a block/flow diagram showing methods for adjusting threshold voltage in transistor devices in accordance with illustrative embodiments.

Referring to FIG. 4, a method for adjusting threshold voltage in transistors is shown in accordance with illustrative embodiments. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 202, a strained liner or liners are deposited on a gate structure to strain a gate dielectric. The gate dielectric may include a high-k dielectric, e.g., HfO$_2$, in which the diffusion length of the WF modulating species is modulated in accordance with the strained liner.

In block 204, the strained liner(s) may include a silicon nitride liner and the strain of the liner is controlled by one or more of deposition temperature or liner thickness. Other controls may also be employed.

In block 206, threshold voltage of a transistor is adjusted by controlling an amount of strain in the liner to control an amount of the WF modulating species that diffuse into the gate dielectric in a channel region. The modulating species may include O, OH, etc. The WF modulating species may include densities in a range between about $0.5\times10^{18}$/cm$^3$ to about $2\times10^{18}$/cm$^3$.

Threshold voltages of different transistors may be adjusted so that different threshold voltages are employed for a plurality of transistors on a same device (wafer or chip). More than one strained liner may be employed on the same device such that more than one threshold voltage is programmed across the same device. The more than one strained liner may each include different strain levels to provide different threshold voltages. In one embodiment, two or more liners may be deposited on two or more different regions of a device such that the liners impart two or more different strain levels on respective gate dielectric layers.

In one embodiment, in block 208, the WF modulating species are present in the liner (e.g., the liner may be formed with the WF modulating species present therein) and the WF modulating species are diffused by annealing the liner/device. In another embodiment, in block 210, the WF modulating species may be implanted through the liner to implant/diffuse the modulating species into the gate dielectric. The WF modulating species may be introduced to the gate dielectric layers such that due to the different strain levels in the gate dielectric layers, different amounts of the WF modulating species diffuse to the gate dielectric layers at a channel region, resulting in different threshold voltage values.

In block 212, the liner or liners are removed. In block 214, processing continues by replacing the liner with a cap layer or other dielectric material. In useful embodiments, the gate structure is recessed by one or more etching processes to make room for the cap layer on top of the gate structure.

Having described preferred embodiments for devices with multiple threshold voltages formed on a single wafer using strain in the high-k layer (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor device having multiple threshold voltages across the device, comprising:
   transistors divided into at least two zones on a same device, with the transistors having a top dielectric layer on a bottom dielectric layer positioned on source/drain regions and a gate structure including a work function (WF) metal conductor, a gate dielectric, spacers, a gate cap, and a main conductor, with the WF metal conductor surrounding the main conductor on at least two sides and the gate dielectric surrounding the WF metal conductor on three sides, wherein top surfaces of the gate cap, the spacers, and the top dielectric layer are coplanar;
   the transistors in a first zone including the gate dielectric having a first density of WF modulating species diffused into the gate dielectric in a channel region to provide a first threshold voltage; and
   the transistors in a second zone including the gate dielectric having a second density of WF modulating species diffused into the gate dielectric in a channel region to provide a second threshold voltage.

2. The device as recited in claim 1, wherein the first density of WF modulating species and the second density of WF modulating species include different densities in a range between about $0.5\times10^{18}$/cm$^3$ to about $9\times10^{18}$/cm$^3$.

3. The device as recited in claim 1, wherein the gate dielectric includes a high-k dielectric in which a diffusion length of the WF modulating species is modulated in accordance with strain.

4. The device as recited in claim 1, wherein the WF modulating species include O and/or OH.

5. The device as recited in claim 1, wherein the same device includes an integrated circuit chip.

6. The device as recited in claim 1, wherein the WF metal conductor includes an n-type WF metal.

7. The device as recited in claim 6, wherein the n-type WF metal includes one or more of titanium nitride (TiN), tantalum nitride (TaN), titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC).

8. The device as recited in claim 1, wherein the WF metal conductor includes a p-type WF metal.

9. The device as recited in claim 8, wherein the p-type WF metal includes one or more of titanium nitride (TiN), tantalum nitride (TaN) and/or tungsten (W).

10. A semiconductor device having multiple threshold voltages across the device, comprising:
    transistors divided into at least two zones on a same device, with the transistors having a top dielectric layer on a bottom dielectric layer positioned on source/drain regions and a gate structure including a gate dielectric, spacers, a gate cap, and a gate conductor, with the gate dielectric surrounding the gate conductor on three sides, wherein top surfaces of the gate cap, the spacers, and the top dielectric layer are coplanar;

the transistors in a first zone including the gate dielectric having a first density of work function (WF) modulating species diffused into the gate dielectric in a channel region to provide a first threshold voltage, wherein the first density of WF modulating species is based on a first diffusion length modulated by a first amount of strain; and the transistors in a second zone including the gate dielectric having a second density of WF modulating species diffused into the gate dielectric in a channel region to provide a second threshold voltage, wherein the second density of WF modulating species is based on a second diffusion length modulated by a second amount of strain.

11. The device as recited in claim 10, wherein the first density of WF modulating species and the second density of WF modulating species include different densities in a range between about $0.5 \times 10^{18}/cm^3$ to about $2 \times 10^{18}/cm^3$.

12. The device as recited in claim 10, wherein the WF modulating species include O and/or OH.

13. The device as recited in claim 10, wherein the same device includes an integrated circuit chip.

14. The device as recited in claim 10, wherein the gate conductor includes an n-type WF metal.

15. The device as recited in claim 14, wherein the n-type WF metal includes one or more of titanium nitride (TiN), tantalum nitride (TaN), titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC).

16. The device as recited in claim 10, wherein the gate conductor includes a p-type WF metal.

17. The device as recited in claim 16, wherein the p-type WF metal includes one or more of titanium nitride (TiN), tantalum nitride (TaN) and/or tungsten (W).

18. The device as recited in claim 10, wherein the gate conductor comprises a WF metal conductor and a main conductor, with the WF metal conductor surrounding the main conductor on at least two sides.

* * * * *